(12) United States Patent
Jeun

(10) Patent No.: US 6,365,965 B1
(45) Date of Patent: Apr. 2, 2002

(54) POWER SEMICONDUCTOR MODULE WITH TERMINALS HAVING HOLES FOR BETTER ADHESION

(75) Inventor: Gi-young Jeun, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/405,030

(22) Filed: Sep. 24, 1999

(30) Foreign Application Priority Data

Nov. 26, 1998 (KR) ............................................. 98-50940

(51) Int. Cl.⁷ ............................................. H01L 23/34
(52) U.S. Cl. ....................... 257/723; 257/181; 257/692; 257/693; 257/698; 257/711
(58) Field of Search ................................. 257/177, 178, 257/179, 180, 181, 182, 685, 774, 692, 693, 696, 698, 723, 119; 438/660

(56) References Cited

U.S. PATENT DOCUMENTS

| | | | | |
|---|---|---|---|---|
| RE30,147 E | * | 11/1979 | Jordan et al. | .................... 65/60 |
| 4,710,795 A | | 12/1987 | Nippert et al. | ................. 357/65 |
| 5,949,088 A | * | 9/1999 | Morgan | ........................... 257/5 |
| 6,037,215 A | * | 3/2000 | Lee et al. | .................... 438/253 |
| 6,037,667 A | * | 3/2000 | Hembree et al. | ............ 257/779 |

FOREIGN PATENT DOCUMENTS

| | | |
|---|---|---|
| JP | 5-335480 | 12/1993 |
| JP | 9-223769 | 8/1997 |

OTHER PUBLICATIONS

Patent Abstract of Japan 9–223769 Supplied from the esp@cenet Database.
Patent Abstract of Japan 5–335480 Supplied from the esp@cenet Database.

* cited by examiner

*Primary Examiner*—Nathan Flynn
*Assistant Examiner*—Leonardo Andujar
(74) *Attorney, Agent, or Firm*—Skjerven Morrill MacPherson LLP; David W. Heid

(57) ABSTRACT

A power semiconductor module, a metal terminal for the power semiconductor module, and methods of fabricating a power semiconductor module and the metal terminal are disclosed. In the power semiconductor module, the metal terminal improves the adhesive strength between the metal terminal and a substrate of the module by increasing the surface area of the metal terminal that contacts an adhesive. A hole and a protrusion formed in an attachment plate of the terminal provide more surface area contacting the adhesive, thereby increasing the adhesive strength between the metal terminal and a metal substrate.

11 Claims, 4 Drawing Sheets

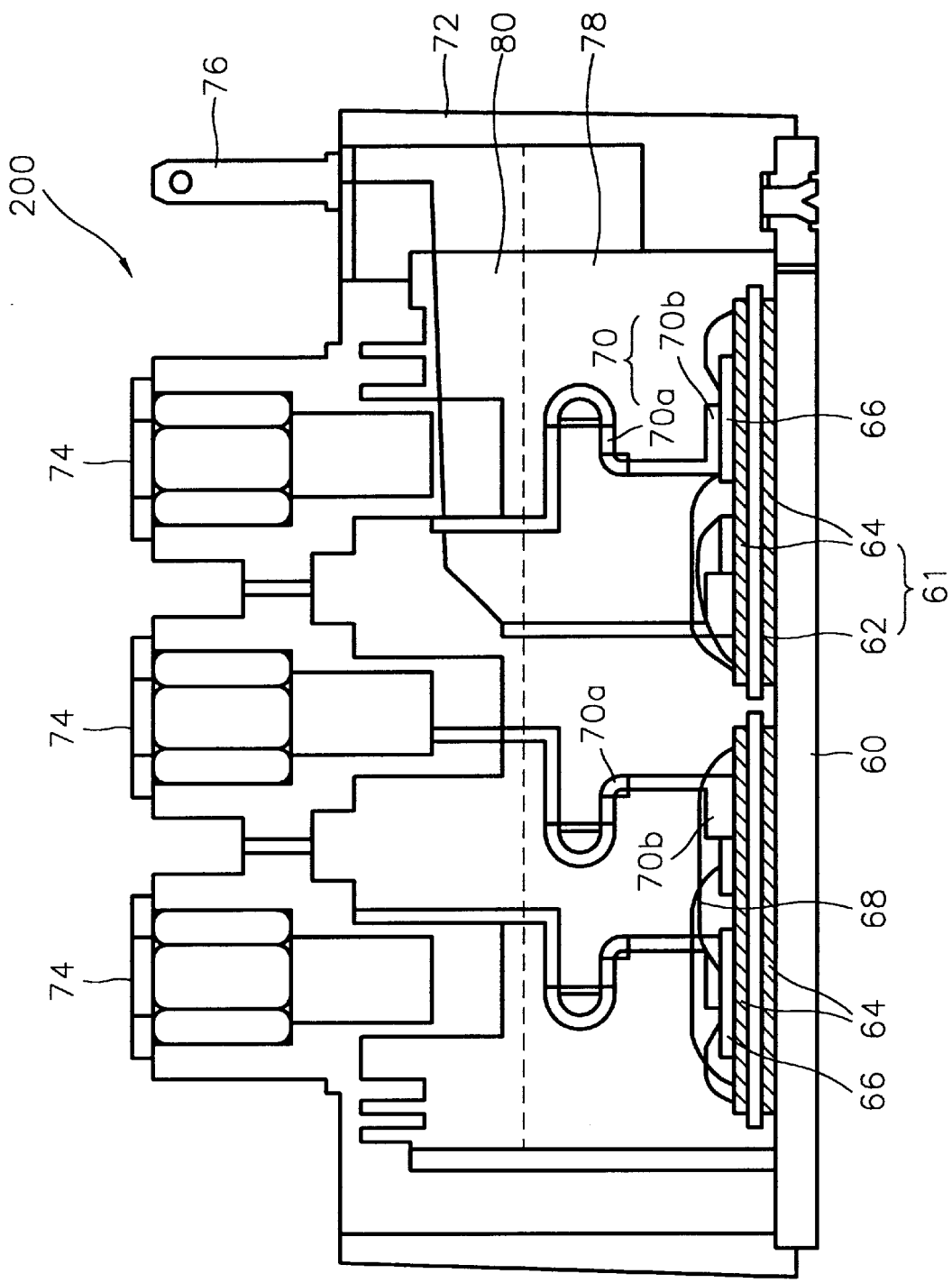

POWER SEMICONDUCTOR MODULE WITH TERMINALS HAVING HOLES FOR BETTER ADHESION

BACKGROUND OF THE INVENTION

1. Field of the Invention

The present invention relates to a semiconductor device and a fabrication method thereof, and more particularly, to a power semiconductor module which has a metal terminal with a strengthened attachment to a conductive metal plate, a method of fabricating the metal terminal of the power semiconductor module, and a method of fabricating the power semiconductor module.

2. Description of the Related Art

Generally, a power semiconductor module is a structure including a power semiconductor chip mounted on a lead frame die pad, a conductive metal plate for heat radiation, and a package body formed of a molding resin such as an epoxy molding compound. A number of metal terminals that connect to a conductive metal plate or pattern on which the chip is attached are in the power semiconductor module. The metal terminals conduct electrical signals between the semiconductor chip and an external element to which the metal terminals connect.

FIG. 1 shows a conventional metal terminal 12 connected to a metal plate 10 of a conventional power semiconductor module. Metal terminal 12 includes a connection rod 12a and an attachment plate 12b. Attachment plate 12b has a flat surface that connects to metal plate 10, and connection rod 12a connects attachment plate 12b to an external element (not shown).

FIG. 2 shows the shape of an adhesive 14 after metal terminal 12 is attached to metal plate 10. In attaching metal terminal 12, adhesive 14 is coated on metal plate 10, and attachment plate 12b of metal terminal 12 is placed on adhesive 14. Then, a downward pressure applied to attachment plate 12b when attaching metal terminal 12 to metal plate 10. This downward pressure on attachment plate 12b can push adhesive 14 out of the interface between attachment plate 12b and metal plate 10. Accordingly, adhesive 14 attaches the side walls of attachment plate 12b to metal plate 10 but is lacking between attachment plate 12 and metal plate 10. The lack of adhesive 14 at the interface may reduce the adhesive strength between attachment plate 12b and metal plate 10, and thus a small external force may separate attachment plate 12b from metal plate 10.

SUMMARY OF THE INVENTION

In accordance with an aspect of the invention, a power semiconductor module including a metal terminal that maintains a strong attachment to a conductive metal plate. The metal terminal includes a hole and/or a protrusion in an attachment plate that attaches to the conductive metal plate. The hole increases the side wall area to which adhesive attaches and thereby increases the strength of the attachment. The protrusion, which is under the attachment plate, creates a gap or space for adhesive under the attachment plate and further increase the area of adhesive attachment and the bond strength.

In accordance with another aspect of the present invention, a method for fabricating a metal terminal for a power semiconductor module includes punching a hole in an attachment plate of the metal terminal. The punching typically creates the hole and a burr-shaped protrusion which extends from the bottom surface of the attachment plate of the terminal.

According to one embodiment of the invention, a power semiconductor module includes: a dielectric substrate and a conductive metal plate or pattern attached to the dielectric substrate; one or more semiconductor chips attached to the conductive metal plate or pattern; a metal wire connecting a pad of the semiconductor chip to the conductive metal plate; and a metal terminal including an attachment plate which contacts with a predetermined area of the conductive metal plate. The metal terminal has a hole in the attachment plate, overlying part of the conductive metal plate, and a connection rod which connects to the attachment plate to an external terminal. The attachment plate may further include a burrshaped protrusion formed around the edge of the hole on a surface placed in contact with the conductive metal plate. The metal terminal can be formed of copper or an alloy of copper and can be surface-treated to resist oxidation. The hole can have a circular, a rectangular, or other geometrical shape. Further, multiple holes can be provide in the attachment plate.

An adhesive surrounds the edge of the attachment plate, fills the gap between the attachment plate and the conductive metal plate, and fills the hole to thereby attach the metal terminal to the conductive metal plate Typically, the power semiconductor module further includes: a heat sink attached to the bottom surface of the dielectric substrate; and an external vessel that attaches to the edge of the heat sink and protects devices within the module. The lower interior space of the external vessel can be filled with a gel-type soft resin, and the upper interior space can be filled with a hard resin.

In accordance with another embodiment of the invention, a method of fabricating a metal terminal includes: fabricating a metal terminal having an attachment plate for attachment to a conductive metal plate; and forming a hole through the attachment plate of the metal terminal by punching. The metal terminal can be surface-treated to prevent oxidation. Punching typically forms the hole. In particular, a punching machine pressing down on the attachment plate forms the hole with a surrounding protrusion below the attachment plate. The protrusion when in contact with a conductive plate creates a gap for adhesive between the attachment plate and the underlying conductive plate.

In accordance with another embodiment of the invention, a method of fabricating a power semiconductor module includes: fabricating a dielectric substrate onto which a conductive metal plate or pattern is attached; attaching one or more semiconductor chips to the conductive metal plate; bonding a metal wire to a pad of the semiconductor chip and a region of the conductive metal plate; mounting the dielectric substrate on a heat sink on which an adhesive is coated, and attaching the dielectric substrate to the heat sink by fusing the adhesive; attaching an attachment plate of a metal terminal to the conductive metal plate using an adhesive, the metal terminal having a connection rod and the attachment plate which has a hole formed through a surface to which the conductive metal plate is to be attached; attaching the edge of the heat sink to the external vessel using the adhesive; and filling the lower interior space of the external vessel with a gel-type soft resin, and filling the upper interior space of the external vessel with a hard resin.

Soldering can attach the metal terminal to the conductive metal plate, and an attaching jig is used to hold the metal terminal when the metal terminal is attached to the conductive metal plate.

According to an aspect of the present invention, a metal terminal can maintain a strong attachment to a conductive metal plate, and thus the reliability of a power semiconductor module is improved.

BRIEF DESCRIPTION OF THE DRAWINGS

The features and advantages of the present invention will become more apparent by describing specific embodiments with reference to the attached drawings, in which:

FIG. 5 is a cross-sectional view of a power semiconductor module in accordance with another embodiment of the present invention;

Use of the same reference symbols in different figures indicates similar or identical items.

DESCRIPTION OF THE PREFERRED EMBODIMENT

Figure 3:
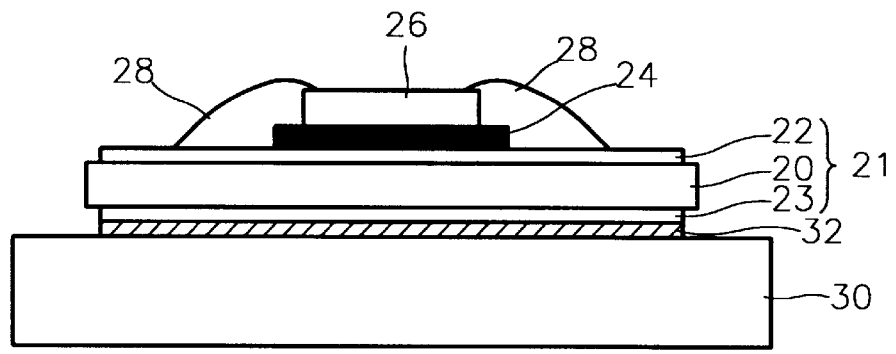
FIG. 3 is a cross-sectional view illustrating a portion of a power semiconductor module including a semiconductor chip mounted on a conductive metal plate wherein the conductive metal plate is on a dielectric substrate.

FIG. 3 shows a chip attaching portion of a power semiconductor module in accordance with an embodiment of the present invention. In FIG. 3, a semiconductor chip 26 is attached to a substrate 21 which includes an insulating (dielectric) substrate 20 and metal plates or patterns 22 and 23 on the top and bottom surfaces of insulating substrate 20. In attaching chip 26 to upper metal pattern 22, a first adhesive 24 such as a solder preform is coated on upper metal pattern 22, and chip 26 is placed on first adhesive 24. Then, heat is applied to fuse substrate 21 and chip 26 to solder preform 24. When cooled, solder preform 24 solidifies and attaches chip 26 to upper metal pattern 22. Solder preform 24 can have various melting points depending on its composition, but usually uses a composition having a melting point of about 300° C.

After the chip attachment, metal wires 28 connect bonding pads (not shown) on semiconductor chip 26 to upper metal pattern 22. Metal wires 28 are typically aluminum (Al) wires having a diameter of 10 mil to 20 mil to endure a high current. A wedge-bonding method can bond wires 28 to the bonding pads and metal pattern 22.

After the wire connection (wirebonding), substrate 21 is placed on a heat sink 30 coated with a second adhesive 32 such as another solder preform. Solder paste (not shown) is coated on a portion of upper metal pattern 22 to which a metal terminal (not shown) is to be attached, and the metal terminal is placed on the portion of upper metal pattern 22. Then, heat sink 30 and substrate 21 are heated in a furnace for soldering between substrate 21 and heat sink 30 and between the metal terminal and upper metal pattern 22. Here, the temperature of the furnace increases until second adhesive 32 between heat sink 30 and dielectric substrate 20 sufficiently melts. Thereafter, adhesive 32 hardens while passing through a cooling zone.

FIG. 3 shows a single semiconductor chip 26 to demonstrate the process for attaching semiconductor chip 26 to substrate 21 and the process for attaching substrate 21 to heat sink 30. However, in practice, several separate semiconductor chips can be attached to several separated conductive metal plates in a single power semiconductor module.

Figure 4:
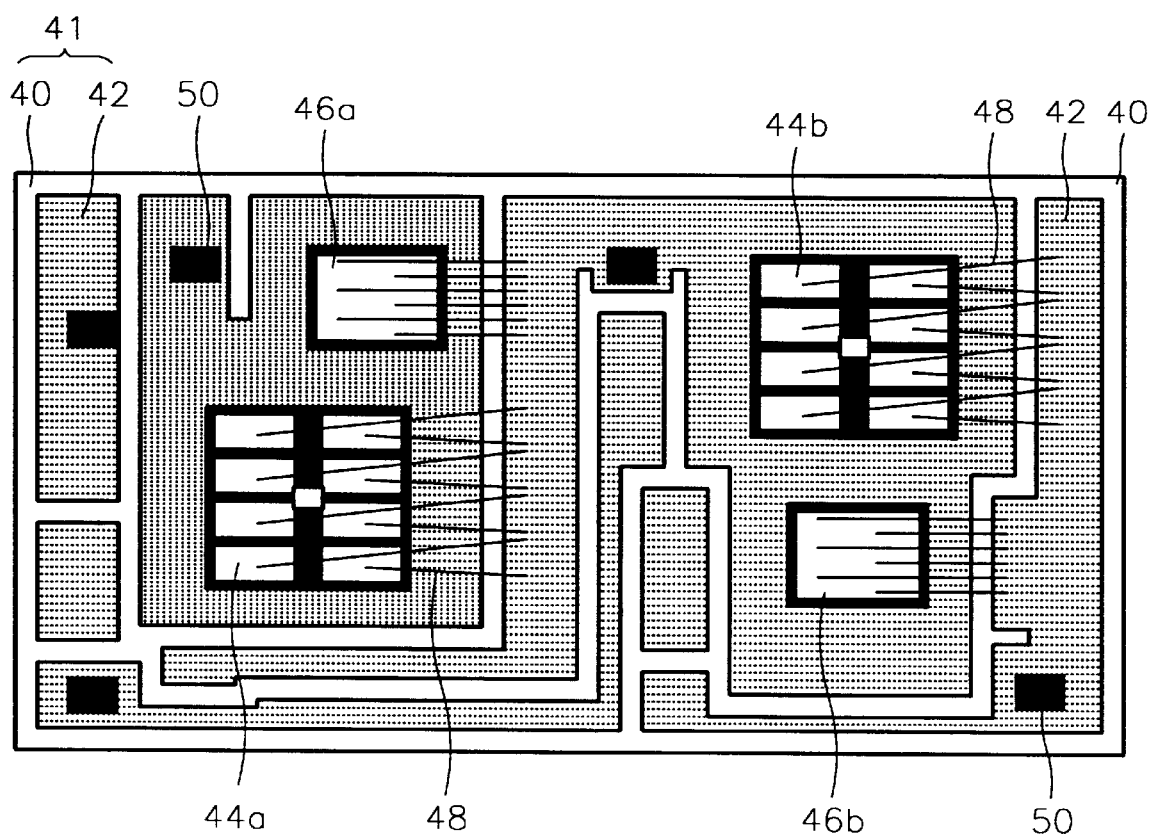
FIG. 4 is a plan view of a substrate of a power semiconductor module in accordance with another embodiment of the present invention.

FIG. 4 shows several semiconductor chips 44a, 44b, 46a and 46b mounted on a substrate 41 in accordance with an embodiment of the invention. Substrate 41 includes an insulating (dielectric) substrate 40 and a metal pattern 42 formed on insulating substrate 40. Chips 44a, 44b, 46a and 46b attach to substrate 41 in the same manner that chip 26 attaches to substrate 21 as described with reference to FIG. 3. In FIG. 4, metal wires 48 attach bonding pads on semiconductor chips 44a, 44b, 46a, and 46b to associated conductive regions of metal pattern 42. Also within the conductive regions of metal pattern 42 are areas 50 to which metal terminals (not shown) attach. Such metal terminals connect respective areas 50 to external terminals (not shown) which can be fastened to an external vessel (not shown).

FIG. 5 is a cross-sectional view of a power semiconductor module 200 in accordance with another embodiment of the invention. Power semiconductor module 200 includes two substrates 61, each of which includes an insulative (dielectric) substrate 62 and metal patterns 64 similar or identical to the insulative substrate 40 and metal patterns 42 of substrate 41 (FIG. 4). Substrates 61 attach to a heat sink 60, and metal terminals 70 connect regions of metal patterns 64 to external terminals 74. Soldering in a furnace as explained with reference to FIG. 3 attaches substrates 61 to heat sink 60 and semiconductor chips 66.

Each metal terminal 70 includes a connection rod 70a and an attachment plate 70b. Attachment plate 70b attaches to metal pattern 64, and connection rod 70a connects attachment plate 70b to the associated external terminal 74 or gate terminal 76.

An adhesive (not shown) attaches an external vessel 72 to the edges of heat sink 60. The lower part of external vessel 72 is sealed by a gel-type soft resin 78 which acts as an insulator, and the upper part external vessel 72 is filled with a hard resin 80.

In attaching metal terminals 70 to substrates 61, attaching jigs (not shown) align terminals 70 and metal patterns 64 and prevent misalignment or movement due to the motion of on a furnace conveyor belt during soldering. The attaching jigs press metal terminals 70 down against metal patterns 64 on substrates 61 while metal terminals 70 are soldered.

Figure 6A:
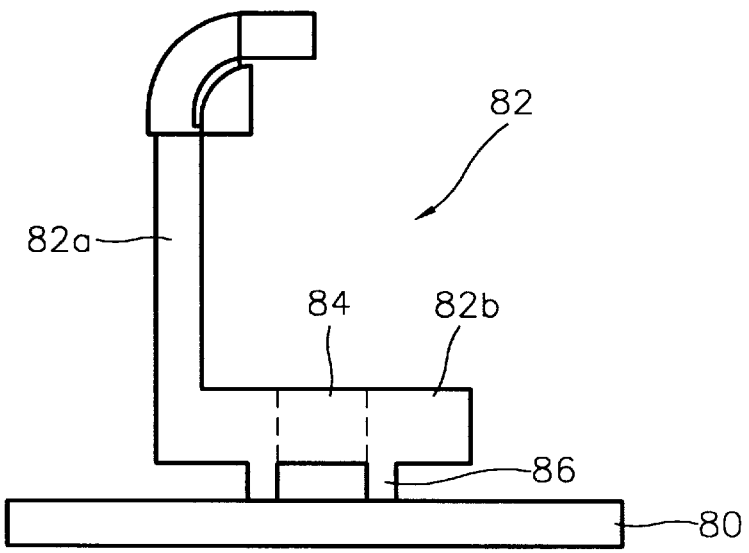
FIG. 6A is a vertical cross-sectional view of a metal terminal in accordance with another embodiment of the present invention.
Figure 6B:
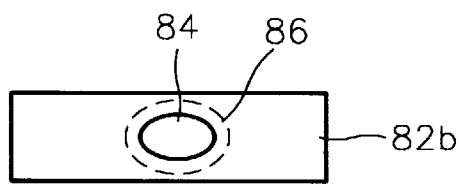
FIG. 6B is a horizontal view of an attachment plate of the metal terminal of FIG. 6A.

FIGS. 6A and 6B illustrate a metal terminal 82 that can be used in the module of FIG. 5. Metal terminal 82 includes an attachment plate 82b which connects to a predetermined area of a conductive metal plate 80 and a connection rod 82a which connects to attachment plate 82b. The other end of connection rod 82a connects to an external terminal (not shown). Attachment plate 82b includes a hole 84 overlying metal plate 80 and a protrusion 86 formed around hole 84 on the bottom surface of attachment plate 82b. Protrusion 86 contacts metal substrate 80 and improves the adhesive strength between metal terminal 82 and metal plate 80 by making space for adhesive such as solder under metal terminal 82. Metal terminal 82 contains copper (Cu) or a Cu alloy and is surface-treated to resist oxidation. Hole 84 can have various geometrical shapes such as a circle or a rectangle, and multiple holes can be included in attachment plate 82b.

Metal terminal 82 as initially manufactured has attachment plate 82b for attachment to conductive metal plate 80, and connection rod 82a which connects to the attachment plate 82b. Hole 84 and protrusion 86 can be formed in the attachment plate 82b by punching attachment plate 82b. The punching process is performed by pressing a punching machine down on attachment plate 82b to form hole 84 and a burr-shaped protrusion 86 under attachment plate 82b. Thereafter, metal terminal 82 is surface-treated to prevent oxidation.

Figure 1:
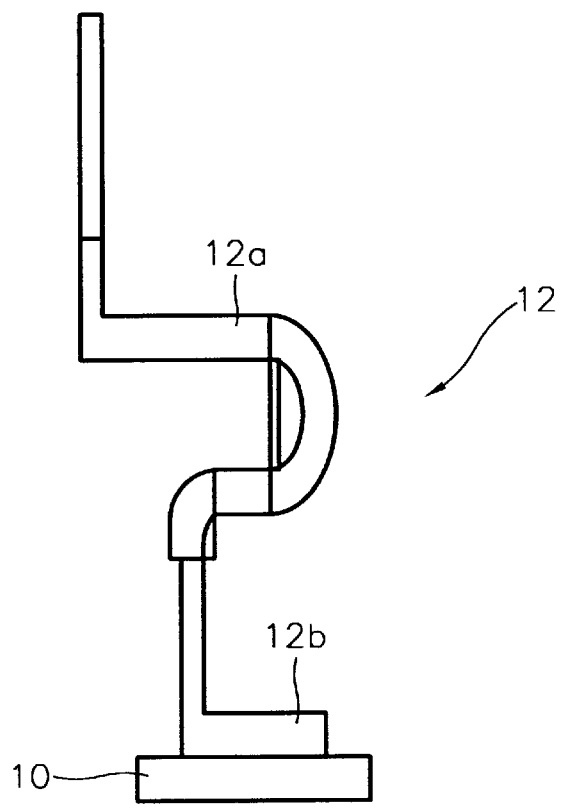
FIG. 1 is a cross-sectional view of a conventional metal terminal of a power semiconductor module.
Figure 2:
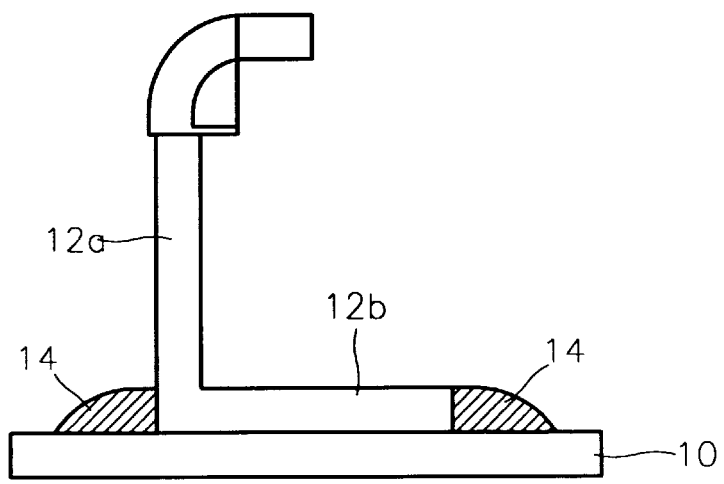
FIG. 2 is a cross-sectional view of a conventional metal terminal of FIG. 1 illustrating an adhesive.
Figure 7:
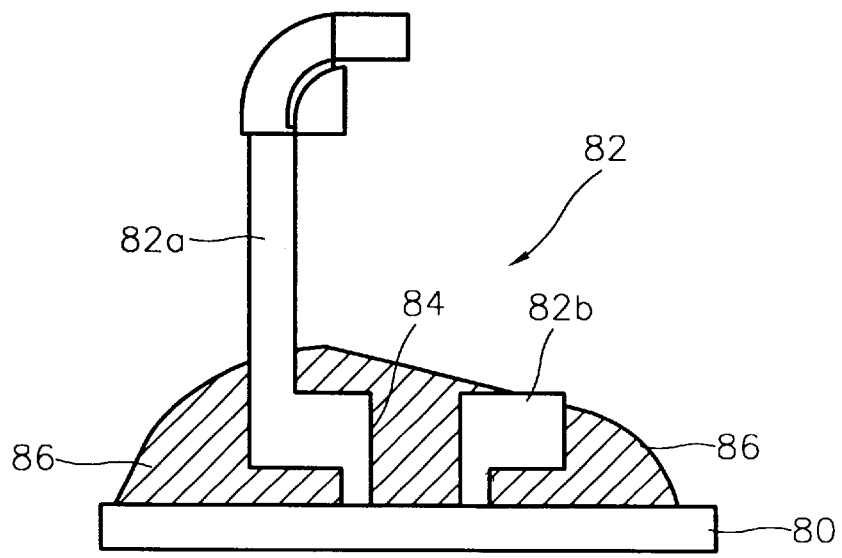
FIG. 7 is a cross-sectional view of the metal terminal of FIG. 6A with an adhesive.

FIG. 7 illustrates the shape of an adhesive 88 after attaching metal terminal 82 of FIG. 6A to metal plate 80. In particular, after soldering in a furnace, adhesive 88 surrounds attachment plate 82b, fills a gap between attachment plate 82b and metal plate 80, and fills hole 84. In the device of FIG. 2, pressure applied during the conventional attachment process squeezes adhesive 14 out of the interface between attachment plate 12b and metal plate 10 so that adhesive 14 covers only the side wall of attachment plate 12b. Thus, adhesion between attachment plate 12b and metal substrate 10 is weak. On the other hand, adhesive 88 of FIG. 7 not only surrounds the side wall of attachment plate 82b but also attaches to the side walls of hole 84 and fills the gap between attachment plate 82b and metal plate 80. Accordingly, the adhesion between attachment plate 82b and metal plate 80 is stronger than in the device of FIG. 2. In an alternative embodiment of the invention, where protrusion 86 is not formed below attachment plate 82b, an adhesive still remains in the hole 84. This embodiment also has a higher adhesive strength than the device of FIG. 2.

The metal terminal according to the present invention improves the adhesive strength between the metal terminal and a metal substrate by increasing the surface area of the metal terminal that contacts an adhesive. A hole and protrusions formed at the bottom of the metal terminal provide more surface area contacting the adhesive, thereby increasing the adhesive strength between the metal terminal and a metal substrate.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A power semiconductor module comprising:
   a conductive metal plate; and
   a terminal comprising:
      an attachment plate which contacts the conductive metal plate, the attachment plate having a hole over part of the conductive metal plate, wherein the attachment plate further comprises a protrusion formed around the hole on a surface of the attachment plate that contacts the conductive metal plate; and
      a connection rod which connects the attachment plate to an external terminal, further comprising an adhesive that surrounds the attachment plate, fills a gap that the protrusion creates between the attachment plate and the conductive metal plate, and fills the hole, wherein the adhesive attaches the metal terminal to the conductive metal plate.

2. The power semiconductor module of claim 1, wherein the protrusion has a burr shape.

3. The power semiconductor module of claim 1, wherein the metal terminal comprises copper or an alloy of copper.

4. The power semiconductor module of claim 1, wherein the metal terminal is surface-treated for protection from oxidation.

5. The power semiconductor module of claim 1, wherein the hole has a circular shape.

6. A power semiconductor module comprising:
   a conductive metal plate; and
   a terminal comprising:
      an attachment plate which contacts the conductive metal plate, the attachment plate having a hole over part of the conductive metal plate, and
      a connection rod which connects the attachment plate to an external terminal, further comprising an adhesive which surrounds the attachment plate and fills the hole, wherein the adhesive attaches the metal terminal to the conductive metal plate.

7. A power semiconductor module comprising:
   a dielectric substrate;
   a conductive pattern to the dielectric substrate;
   a semiconductor chip attached to the conductive pattern;
   a metal wire for connecting a pad of the semiconductor chip to the conductive pattern; and
   a terminal including:
      an attachment plate that contacts the conductive pattern and has a hole over part of the conductive pattern; and
      a connection rod that connects the attachment plate to an external terminal.

8. The power semiconductor module of claim 7, wherein the attachment plate further comprises a protrusion formed around the hole on a surface of the attachment plate that contacts the conductive pattern.

9. The power semiconductor module of claim 8, wherein the protrusion has a burr shape.

10. The power semiconductor module of claim 7, further comprising:
    a heat sink attached to a bottom surface of dielectric substrate; and
    an external vessel attached to the heat sink, for protecting devices within the module.

11. The power semiconductor module of claim 10, wherein a lower interior space of the external vessel is filled with a gel-type soft resin, and an upper interior space of the external vessel is filled with a hard resin.

* * * * *